United States Patent
Fay et al.

(10) Patent No.: US 7,015,075 B2
(45) Date of Patent: Mar. 21, 2006

(54) DIE ENCAPSULATION USING A POROUS CARRIER

(75) Inventors: Owen R. Fay, Gilbert, AZ (US); Craig S. Amrine, Tempe, AZ (US); Kevin R. Lish, Gilbert, AZ (US)

(73) Assignee: Freescale Semiconuctor, Inc., Austin, TX (US)

( * ) Notice: Subject to any disclaimer, the term of this patent is extended or adjusted under 35 U.S.C. 154(b) by 174 days.

(21) Appl. No.: 10/774,977

(22) Filed: Feb. 9, 2004

(65) Prior Publication Data

US 2005/0176180 A1 Aug. 11, 2005

(51) Int. Cl.
H01L 21/50 (2006.01)
H01L 21/48 (2006.01)
H01L 21/44 (2006.01)

(52) U.S. Cl. ............... 438/127; 438/106; 438/112; 438/118

(58) Field of Classification Search ............ 438/106, 438/112, 118, 127; 257/686
See application file for complete search history.

(56) References Cited

U.S. PATENT DOCUMENTS

| | | | |
|---|---|---|---|
| 4,918,811 A | 4/1990 | Eichelberger et al. | |
| 5,032,543 A | 7/1991 | Black et al. | |
| 5,144,747 A | 9/1992 | Eichelberger | |
| 5,250,843 A | 10/1993 | Eichelberger | |
| 5,620,928 A * | 4/1997 | Lee et al. | 438/118 |
| 5,830,800 A * | 11/1998 | Lin | 438/459 |
| 5,866,952 A | 2/1999 | Wojnarowski et al. | |
| 6,036,173 A * | 3/2000 | Neu et al. | 257/668 |
| 6,159,767 A | 12/2000 | Eichelberger | |
| 6,319,828 B1 * | 11/2001 | Jeong et al. | 438/674 |
| 6,370,293 B1 * | 4/2002 | Emmerich et al. | 385/14 |
| 6,528,145 B1 * | 3/2003 | Berger et al. | 428/156 |
| 6,613,413 B1 * | 9/2003 | Japp et al. | 428/131 |

FOREIGN PATENT DOCUMENTS

| | | |
|---|---|---|
| JP | 2002-362677 A * | 12/2002 |
| WO | WO 02/33751 A2 | 4/2002 |

OTHER PUBLICATIONS

JP 2002-362677 A, Dec. 2002, Takaoka et al., Translation.*

* cited by examiner

Primary Examiner—Maria F. Guerrero
(74) Attorney, Agent, or Firm—David G. Dolezal; Joanna G. Chiu

(57) ABSTRACT

A process for encapsulating an integrated circuit die (403) using a porous carrier (101). In one example, an adhesive structure (e.g. tape) is applied to a porous carrier. Integrated circuit die is then placed on the adhesive structure. The integrated circuit die is then encapsulated to form an encapsulated structure (505). The carrier is then subjected to a solvent that passes through the carrier to reduce the adhesive strength of the adhesive structure for removal of the carrier from the encapsulated structure.

34 Claims, 1 Drawing Sheet

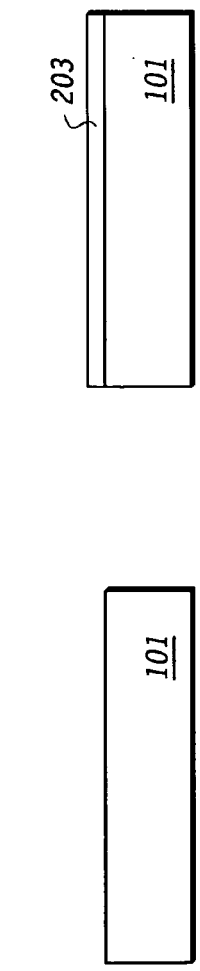
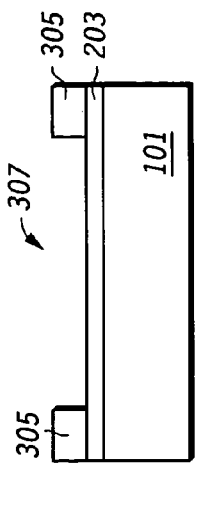
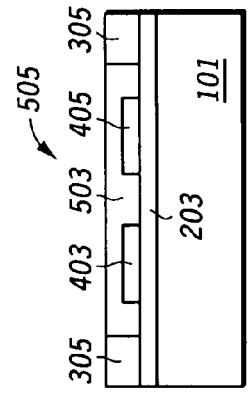
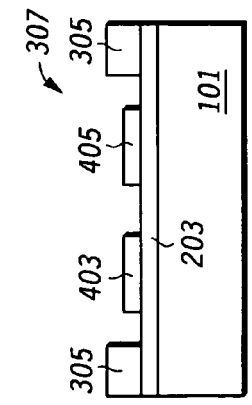
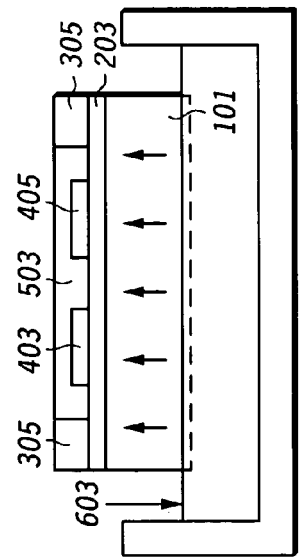
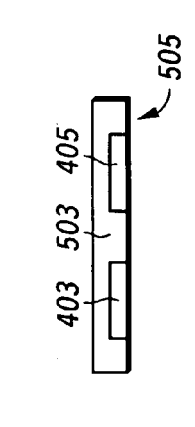
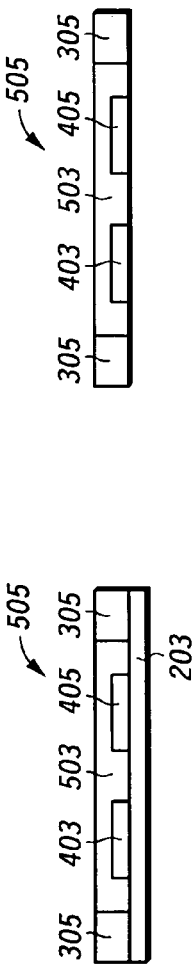
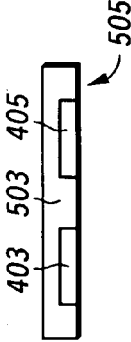

DIE ENCAPSULATION USING A POROUS CARRIER

BACKGROUND OF THE INVENTION

1. Field of the Invention

This invention relates in general to integrated circuit (IC) die encapsulation.

2. Description of the Related Art

Carriers are utilized for supporting IC die during encapsulation processes in the manufacture of packaged integrated circuits. With some processes, IC die are attached to a carrier with tape or other types of attaching structures. A mold is placed around the IC die where encapsulate is then applied to the die with the tape defining the bottom surface of the mold outside of the die. After the encapsulant has been cured, the carrier is removed from the encapsulated structure by heating the tape to soften the adhesives of the tape. The tape is then removed from the encapsulated structure.

One problem with heating the tape for carrier removal is that the heat applied to the encapsulated structure may cause the die to drift from a desired location within the encapsulated structure.

In other carrier removal processes, the adhesive of the tape may be degraded by applying Ultra Violet (UV) radiation to the tape. However, with these processes, the UV degradable adhesive on the tape may not function adequately after being subjected to the curing temperatures of the encapsulation processes.

What is needed is an improved method for packaging an integrated circuit die.

BRIEF DESCRIPTION OF THE DRAWINGS

The present invention may be better understood, and its numerous objects, features, and advantages made apparent to those skilled in the art by referencing the accompanying drawings.

FIG. 1 is a cross sectional view of one embodiment of a carrier according to the present invention.

FIG. 2 is a cross sectional view of one embodiment of a carrier with adhesive tape applied on top thereof during a stage in the manufacture of a packaged integrated circuit according to the present invention.

FIG. 3 is a cross sectional view of one embodiment of a carrier, adhesive tape, and an encapsulant mold during another stage in the manufacture of a packaged integrated circuit according to the present invention.

FIG. 4 is a cross sectional view of one embodiment of a carrier, adhesive tape, an encapsulant mold, and IC die during another stage in the manufacture of a packaged integrated circuit according to the present invention.

FIG. 5 is a cross sectional view of one embodiment of a carrier, adhesive tape, an encapsulant mold, and an encapsulated structure during another stage in the manufacture of a packaged integrated circuit according to the present invention.

FIG. 6 is a cross sectional view of one embodiment of a carrier, adhesive tape, an encapsulant mold, and an encapsulated structure during another stage in the manufacture of a packaged integrated circuit according to the present invention.

FIG. 7 is a cross sectional view of one embodiment of adhesive tape, an encapsulant mold, and an encapsulated structure after the removal of the carrier during another stage in the manufacture of a packaged integrated circuit according to the present invention.

FIG. 8 is a cross sectional view of one embodiment of an encapsulant mold and an encapsulated structure after the removal of tape during another stage in the manufacture of a packaged integrated circuit according to the present invention.

FIG. 9 is a cross sectional view of one embodiment of an encapsulated structure after the removal of the encapsulant mold during another stage in the manufacture of a packaged integrated circuit according to the present invention.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

FIGS. 1–9 show one embodiment of various stages of a process for encapsulating an IC die with the use of a porous carrier to allow for solvent to pass through the carrier to reduce the adhesive strength of an adhesive structure for the removal of a carrier from an encapsulated structure.

FIG. 1 is a cross sectional view of carrier 101 prior to the application of a tape for an encapsulating process. Carrier 101 is porous in that has pores that allow a solvent to pass through from one side of the carrier to another side. In one embodiment, carrier 101 is made of a composite material of aluminum oxide embedded in a glass matrix. In other embodiments, carrier 101 may be made with other material such as e.g. metal, ceramics, glass, plastics, polymer or a combination thereof, where such materials are made to have a continuous open porosity. In some embodiments, the carrier is made of a material that can withstand temperatures of the encapsulation process (e.g. 150 C).

In one embodiment, carrier 101 has pores with a 0.2 micron diameter pore size and a coefficient of thermal expansion (CTE) of 8 parts per million (ppm). In other embodiments, the pore size of carrier 101 may range from 0.02 microns up to 30 microns. In other embodiments, the pore size may be bigger. However, in some embodiments, a larger pore size may affect the smoothness of the surface of the carrier beyond a smoothness level that is desired. In one embodiment, the desired smoothness of the surface of the carrier is dependent upon the type of adhesive structure utilized for attachment of IC die. With some embodiments, the adhesive structure may be applied as a planar layer thereby allowing for a carrier to have larger pore sizes.

A carrier with pores of a smaller pore size may be used. However, with a smaller pore size, a reduced amount of solvent passes thought the carrier. With some embodiments, the time needed for reducing the strength of the adhesive structure is dependent upon the amount of solvent passing through the carrier. Accordingly, with some embodiments, carriers with an open continuous porosity of a 0.02 micron diameter pour size or greater are utilized depending upon the amount of solvent desired to be passed through. Also, utilizing a carrier with pores of a smaller size may affect the reusability of the carrier in that the small pores may become clogged.

With other embodiments, carrier 101 may have CTE of other values. In some embodiments, the CTE of carrier 101 is less than the CTE of an encapsulant used for encapsulating the IC die. In some embodiments, the encapsulant has a CTE ranging from 0.5–20 ppm.

Referring to FIG. 2, tape 203 is applied to the top surface of carrier 101. Prior to applying tape 203, carrier 101 is cleaned e.g. by baking and scrubbing. In one embodiment, tape 203 is a two sided adhesive tape. The die side (the top side in the view of FIG. 2) of tape 203 has a silicone adhesive material with a thickness of 50 microns, but may be of other thicknesses (e.g. 12–100 microns) and/or of other adhesive materials (e.g. acrylic or organic) in other embodiments.

In one embodiment, the carrier side (the bottom side in the view of FIG. 2) of tape 203 has a silicone adhesive material with a thickness of 75 microns. In other embodiments, the carrier side adhesive material may be of other types of adhesive material (e.g. acrylic or organic) and/or may be of other thicknesses. In some embodiments, the thickness of the carrier side adhesive material should be thick enough to fill in pores or other voids in the top side of carrier 101 so as to "planarize" the top surface of carrier 101. However, in some embodiments, the maximum thickness of the carrier side adhesive material is limited by the ability to release the carrier from tape 203 with solvent. In some embodiments, the thickness of the carrier side adhesive material may range from 12–100 microns, but may be of other thicknesses in other embodiments. In one embodiment, the tape has an adhesive material on the die side that is greater than 30 microns and an adhesive material on the carrier side that is greater than 50 microns. In some embodiments, the silicone adhesive may have additives to increase or decrease the silicone strength. In one embodiment, the die side and carrier side adhesive materials are separated by a tape carrier (e.g. polyester or polyamide).

FIG. 3 shows a cross sectional view of carrier 101 after an encapsulant mold is placed on top of tape 203. Mold 305 has an opening 307 for exposing the middle portion of tape 203.

Referring to FIG. 4, integrated circuit die 403 and 405 are placed on tape 203 in opening 307 in predefined locations. In one embodiment, multiple die are placed in an array configuration (e.g. 4×6, 6×6, or 8×8) on tape 203. In one embodiment, the die are placed on tape 203 by a standard pick and place method, but may be placed on tape 203 by other methods.

In one embodiment, die 403 and 405 include integrated circuits built on a semiconductor wafer which was subsequently singulated into separate die. In the embodiment shown, die 403 and 405 have a flip chip configuration and are placed active side down on tape 203, wherein the bond pads (not show) are located on the bottom sides of die 403 and 405 relative to the view shown in FIG. 4.

Referring to FIG. 5, an encapsulant material is dispensed (e.g. with syringe and robotic needle) into opening 307 to form an encapsulant 503 that encapsulates die 403 and 405 in an encapsulated structure 505. In other embodiments, encapsulant 503 may be formed by other encapsulating processes such as e.g. screen print, extrusion coating, transfer mold, ejection mold, glob top, or other encapsulating processes.

Referring to FIG. 6, the bottom portion of carrier 101 is placed in a solvent bath 603. Solvent from solvent bath 603 is absorbed up through the carrier via a capillary action where it contacts the carrier side adhesive material of tape 203. The solvent breaks down the adhesive strength of the carrier side adhesive material of tape 203. In one embodiment where the solvent is acetone and the adhesive material is a silicone adhesive, the solvent softens the adhesive property of the silicone adhesive. In one embodiment, the bottom portion of carrier 101 is placed in bath 603 for about 5 minutes before carrier 101 separates from tape 203. In other embodiments, a greater portion of the carrier may be submerged in bath 603. In some embodiments, the entire carrier/mold/encapsulated structure may be submerged in bath 603.

One advantage of using a porous carrier where solvent passes through the carrier is that the carrier removal process may be performed at room temperature, or in some embodiments, at least at temperatures below the transition temperature ($T_g$) of the encapsulant. Thus, the carrier may be removed from the encapsulated structure 505 without causing die 403 and 405 to drift within encapsulated structure 505. In one embodiment, the transition temperature of encapsulant 503 is about 140 C. In other embodiments, other types of encapsulant material may have a $T_g$ ranging from 90 C, to 200 C.

FIG. 7 shows a cross sectional view of mold 305, encapsulated structure 505, and tape 203 after carrier 101 has been removed.

Referring to FIG. 8, tape 203 is pulled from encapsulated structure 505 and mold 305. Referring to FIG. 9, mold 305 is removed from encapsulated structure 505. In some embodiments, structure 505 is subject to further buildup processes (e.g. dielectric and metal interconnect processing) on the active side of the die to form interconnect structures (not shown). Encapsulated structure 505 is then singulated into a plurality of packaged ICs.

In one embodiment, each packaged IC includes one IC die (e.g. 403). However, in other embodiments, each packaged IC may include multiple die (e.g. in stacked or side by side configurations). Also, package ICs of other embodiments may include stand alone devices (e.g. transistors, filters, capacitors, amplifiers) that are encapsulated in the encapsulant (e.g. 503). These additional items by be placed on tape 203 prior to encapsulation. In some embodiments, entire embedded systems (e.g. multichip modules, RF systems, or other wireless or information processing systems) may be included in a packaged IC.

In other embodiments, a package substrate may be located between tape 203 and the IC die (e.g. 405) with, in some embodiments, the package substrate defining the bottom portion of the encapsulant. In one embodiment, the IC die are mounted to the packaged substrate, and then the package substrate is placed in opening 307. In other embodiments, the package substrate is first placed on tape 203 in opening 307 and then the IC die are placed on the substrate. In other embodiments, the die may be placed on the packaged substrate active side up wherein wire bonds are attached to bond pads on the active side and bond pads on the package substrate prior to encapsulation.

In other embodiments, other types of adhesive structures may be used in place of tape 203. For example, two layers of tape may used for attaching an integrated circuit die. One layer of tape would have adhesive material on two sides and the other layer would have adhesive on only one side.

In other embodiments, photo resist or other types of adhesives (e.g. organic adhesives) may be used as an adhesive structure for attaching the die to the carrier. In some such embodiments, a first layer of photo resist (not shown) would be applied to the top surface of carrier 101. After the curing process to cure the first layer of photo resist, a second layer of photo resist is applied on the cured layer of photo resist. The IC die are then placed on the second layer of photo resist. Afterwards, the second layer of photo resist is cured. In another embodiment, a dry film photo resist or other adhesive may be used where only one layer is used for attaching the die to the carrier. An example of one such adhesive is RISTON as sold by DUPONT.

With some embodiments having a photo resist or adhesive structure, acetone or N-Methyl 2-Pyrrolidone (NMP) may be used as a solvent that dissolves the photo resist or adhesive layer(s) (e.g. as when the bottom portion of carrier 101 is placed in a solvent bath).

In other embodiments, other types of adhesive structures may be used including, e.g., other types of adhesive materials or other types of photo resist materials. In some embodiments, the adhesive structure is able to withstand curing temperatures for curing the encapsulant.

In one aspect of the invention, a method includes providing a porous carrier, providing an adhesive structure overlying the porous carrier, and placing a first integrated circuit die over the adhesive structure. The method also includes encapsulating the first integrated circuit die to form an encapsulated structure and separating the porous carrier from the encapsulated structure.

In another aspect of the invention, a method includes providing a porous carrier, adhering an adhesive structure to the porous carrier, and placing at least one integrated circuit die over the adhesive structure. The method also includes encapsulating the at least one integrated circuit die to form an encapsulated structure and removing the porous carrier from the encapsulated structure. The removing includes using a solvent that is passed through the porous carrier to reduce adhesive strength between the adhesive structure and the porous carrier.

In another aspect of the invention, a method includes providing a reusable porous carrier including pores with a pore size diameter of at least 0.02 microns, adhering an adhesive structure to the reusable porous carrier, and placing a plurality of integrated circuit die in an array configuration over the adhesive structure. The method also includes encapsulating the plurality of integrated circuit die to form an encapsulated structure and separating the reusable porous carrier from the encapsulated structure. The separating comprises using a solvent that is passed through the porous carrier to reduce adhesive strength between the adhesive structure and the reusable porous carrier.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method comprising:
   providing a porous carrier;
   providing an adhesive structure overlying the porous carrier;
   placing a first integrated circuit die over the adhesive structure;
   encapsulating the first integrated circuit die to form an encapsulated structure; and
   separating the porous carrier from the encapsulated structure, wherein the adhesive structure comprises an adhesive material in contact with the porous carrier, and wherein the separating the porous carrier from the encapsulated structure comprises using a solvent that is passed through the porous carrier to affect the adhesive structure.

2. The method of claim 1, wherein the using the solvent to affect the adhesive structure comprises using the solvent to reduce adhesive strength between the porous carrier and the adhesive material of the adhesive structure.

3. The method of claim 1, wherein the adhesive material is soluble by the solvent that is passed through the porous carrier.

4. The method of claim 1, wherein the adhesive structure comprises tape.

5. The method of claim 1, wherein the adhesive structure comprises photo resist.

6. The method of claim 1, wherein the porous carrier comprises at least one material selected from a group consisting of metal, ceramic, glass, plastic, and polymer.

7. The method of claim 1, further comprising:
   prior to the encapsulating, placing a second integrated circuit die over the adhesive structure, wherein the encapsulating comprises encapsulating the first integrated circuit die and the second integrated circuit die to form the encapsulated structure.

8. The method of claim 1, wherein after the separating the porous carrier from the encapsulated structure, the method further comprises:
   providing a second adhesive structure overlying the porous carrier;
   placing a second integrated circuit die over the adhesive structure;
   encapsulating the second integrated circuit die to form a second encapsulated structure; and
   separating the porous carrier from the second encapsulated structure.

9. The method of claim 1, wherein the porous carrier comprises pores having a pore size diameter in a range of 0.02 microns to 30 microns.

10. The method of claim 1, wherein the adhesive structure comprises two-sided adhesive tape.

11. The method of claim 1, wherein the porous carrier is characterized by an open continuous porosity having at least a 0.02 microns diameter pore size.

12. The method of claim 10, wherein the two-sided adhesive tape comprises a die side adhesive material having a thickness of at least 30 microns and a carrier side adhesive material having a thickness of at least 50 microns, wherein the carrier side adhesive material is between the die side adhesive material and the porous carrier.

13. The method of claim 11, wherein the open continuous porosity has at most a 0.3 microns diameter pore size.

14. A method comprising:
   providing a porous carrier, wherein the porous carrier comprises aluminum oxide embedded in a glass matrix;
   providing an adhesive structure overlying the porous carrier;
   placing a first integrated circuit die over the adhesive structure;
   encapsulating the first integrated circuit die to form an encapsulated structure; and
   separating the porous carrier from the encapsulated structure.

15. A method comprising:
   providing a porous carrier;
   adhering an adhesive structure to the porous carrier;
   placing at least one integrated circuit die over the adhesive structure;
   encapsulating the at least one integrated circuit die to form an encapsulated structure; and
   removing the porous carrier from the encapsulated structure, wherein the removing comprises using a solvent that is passed through the porous carrier to reduce adhesive strength between the adhesive structure and the porous carrier.

16. The method of claim 15, wherein the solvent softens at least a portion of the adhesive structure.

17. The method of claim 15, wherein the solvent dissolves at least a portion of the adhesive structure.

18. The method of claim 15, wherein the removing the porous carrier is preformed at a temperature below a transition temperature (Tg) of an encapsulant material used in the encapsulating.

19. The method of claim 15, wherein the placing at least one integrated circuit die over the adhesive structure comprises placing a plurality of integrated circuit die in an array configuration over the adhesive structure, and wherein the encapsulating comprises encapsulating the plurality of integrated circuit die.

20. The method of claim 15, wherein the porous carrier is be reusable.

21. The method of claim 15, wherein the porous carrier comprises pores having a pore size diameter in a range of 0.02 microns to 30 microns.

22. The method of claim 15, wherein the porous carrier comprises at least one material selected from a group consisting of metal, ceramic, glass, plastic, and polymer.

23. The method or claim 15, wherein the using the solvent that is passed through the porous cater comprises placing at least a portion of the porous carrier into a bath having the solvent wherein the solvent is absorbed through the porous carrier via capillary action.

24. The method of claim 15, wherein the placing the at least one integrated circuit die over the adhesive structure comprises:
    placing the at least one integrated circuit die over a package substrate; and
    placing the package substrate over the adhesive structure.

25. The method of claim 15, wherein the adhesive structure comprises a tape.

26. The method of claim 15, wherein the porous carrier is characterized by an open continuous porosity having at least a 0.02 microns diameter pore size.

27. The method of claim 25, wherein the tape comprises a die side adhesive material having a thickness of at least 30 microns and a carrier side adhesive material having a thickness of at least 50 microns, wherein the carrier side adhesive material is in contact with the porous carrier.

28. The method of claim 26, wherein the open continuous porosity has at most a 0.3 microns diameter pore size.

29. A method comprising:
    providing a reusable porous carrier including pores with a pore size diameter of at least 0.02 microns;
    adhering an adhesive structure to the reusable porous carrier;
    placing a plurality of integrated circuit die in an array configuration over the adhesive structure;
    encapsulating the plurality of integrated circuit die to form an encapsulated structure; and
    separating the reusable porous carrier from the encapsulated structure, wherein the separating comprises using a solvent that is passed through the porous carrier to reduce adhesive strength between the adhesive structure and the reusable porous carrier.

30. The method of claim 29, wherein after the separating, the method further comprises:
    adhering a second adhesive structure to the reusable porous carrier;
    placing a second plurality of integrated circuit die over the second adhesive structure;
    encapsulating the second plurality of integrated circuit die to form a second encapsulated structure; and
    separating the reusable porous carrier from the second encapsulated structure.

31. The method of claim 29, wherein the reusable porous carrier comprises at least one material selected from a group consisting of metal, ceramic, glass, plastic, and polymer.

32. The method of claim 29, wherein the reusable porous carrier comprises aluminum oxide embedded in a glass matrix.

33. The method of claim 29, wherein the reusable porous carrier is characterized by an open continuous porosity having at most a 0.3 microns diameter pore size.

34. The method of claim 29, wherein the separating is performed at a temperature of at most 90 degrees Celsius.

* * * * *

UNITED STATES PATENT AND TRADEMARK OFFICE
CERTIFICATE OF CORRECTION

| | | |
|---|---|---|
| PATENT NO. | : 7,015,075 B2 | Page 1 of 1 |
| APPLICATION NO. | : 10/774977 | |
| DATED | : March 21, 2006 | |
| INVENTOR(S) | : Owen R. Fay | |

It is certified that error appears in the above-identified patent and that said Letters Patent is hereby corrected as shown below:

In Column 7, Line 24, Claim No. 23:

Change "cater" to --carrier--

Signed and Sealed this

Twentieth Day of March, 2007

JON W. DUDAS
*Director of the United States Patent and Trademark Office*